United States Patent [19]

Bartha et al.

[11] Patent Number: 4,918,033

[45] Date of Patent: Apr. 17, 1990

[54] PECVD (PLASMA ENHANCED CHEMICAL VAPOR DEPOSITION) METHOD FOR DEPOSITING OF TUNGSTEN OR LAYERS CONTAINING TUNGSTEN BY IN SITU FORMATION OF TUNGSTEN FLUORIDES

[75] Inventors: Johann W. Bartha; Thomas Bayer, both of Sindelfingen; Johann Greschner, Pleizhausen; Georg Kraus, Wildberg; Gerhard Schmid, Leinfelden-Echterdingen, all of Fed. Rep. of Germany

[73] Assignee: International Business Machines Corporation, Armonk, N.Y.

[21] Appl. No.: 239,569

[22] Filed: Sep. 1, 1988

[30] Foreign Application Priority Data

Dec. 24, 1987 [EP] European Pat. Off. ........... 87119192

[51] Int. Cl.$^4$ .................... H01L 21/00; H01L 21/02; H01L 21/285; H01L 21/88
[52] U.S. Cl. .................................. 437/245; 437/187; 437/189; 437/192; 437/200; 427/38; 427/39; 204/192.12; 204/192.15; 148/DIG. 147
[58] Field of Search ............... 437/225, 228, 245, 192, 437/200; 148/DIG. 147; 427/38, 39, 50, 51; 156/643

[56] References Cited

U.S. PATENT DOCUMENTS

| | | | |
|---|---|---|---|
| 4,138,512 | 2/1979 | Glaski | 427/237 |
| 4,517,225 | 5/1985 | Broadbent | 427/89 |
| 4,617,087 | 10/1986 | Iyer | 156/643 |

FOREIGN PATENT DOCUMENTS

0100669 12/1981 Japan .

OTHER PUBLICATIONS

Zarowin, C., IBM Technical Disclosure Bulletin, vol. 21, No. 9, Feb. 1979, p. 3832, Room Temperature, Plasma Chemical Transport Deposit. of Metal (Gold) Films.
Gorowitz, B., Application of Plasma Enhanced Chemical Vapor Deposit. in VLSI, Sol. Stat. Tech., Jun. 1985, pp. 197–203.
Sze, S., VLSI Technology, Chap. 3, pp. 93–94, McGraw-Hill, 1983.
Schmitz, J., Comparison of Step Coverage and Other Aspects of the $H_2/WF_6$ $SiH_4/WF_6$ Reduction Schemes Used in Blanket LPCVD of Tungsten, Electrochem. Soc.; vol. 87–88, Oct. 1987.
Akitmoto, K., Formation of $W_xSi_{1-x}$ by Plasma Chemical Vapor Deposition, Appl. Phys. Lett. 39(5), Sep. 1, 1981.
Brors, D., Low Pressure Chem. Vapor Deposit. of Tungsten Silicide, pp. 82–85, Semicond. Internat., May 1984.
Horwitz, C., Hollow Cathode Reactive Sputter Etching-A New High-Rate Process, pp. 977–979, Appl. Phys. Lett. 43(10), Nov. 15, 1983.
Bartha, J., In Situ Determin. of Growth Rate and Stoichiometry in a Heterogen. CVD Reactor, IBM Tech. Dis. Bulletin, vol. 29, No. 11, Apr. 1987, p. 4851.

*Primary Examiner*—Brian E. Hearn
*Assistant Examiner*—B. Everhart
*Attorney, Agent, or Firm*—William D. Sabo

[57] ABSTRACT

The invention comprises a PECVD method for the deposition of refractory metal layers or layers containing refractory metal by the in situ formation of refractory metal fluorides. For this purpose, an etch gas, such as $CF_4$, $NF_3$, $SF_6$ etc., is introduced into a plasma deposition chamber which comprises a cathode, with a refractory metal sheet electrically connected thereto, and an anode carrying wafers.

In a preferred example, $CF_6$ is introduced into the chamber and, via a gas shower, into a cathode region. After ignition of a plasma, the ionized etch gas acts on a tungsten sheet, generating $WF_x$ ions that diffuse towards a target with wafers. The $WF_x$ ions thus produced are suitable for the deposition of a tungsten layer or a layer containing tungsten on silicon wafers.

6 Claims, 2 Drawing Sheets

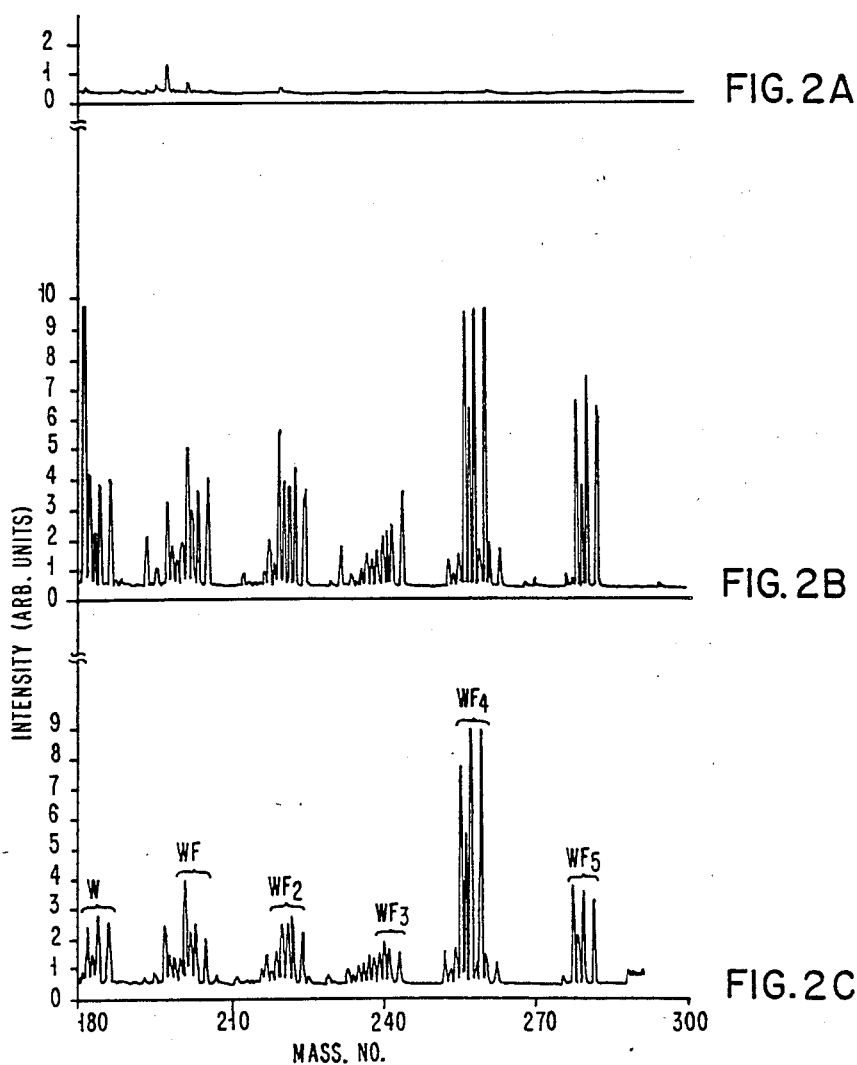

PECVD (PLASMA ENHANCED CHEMICAL VAPOR DEPOSITION) METHOD FOR DEPOSITING OF TUNGSTEN OR LAYERS CONTAINING TUNGSTEN BY IN SITU FORMATION OF TUNGSTEN FLUORIDES

FIELD OF THE INVENTION

The present invention relates generally to the deposition of conductive layers on a substrate. More particularly, it relates to a plasma enhanced CVD process for the deposition of tungsten or layers containing tungsten on a semiconductor surface by in situ formation of tungsten fluorides in the reaction chamber.

BACKGROUND OF THE INVENTION

In the development of VLSI technology, there is a strong demand for improved microfabrication techniques and materials, e. g., refractory metals, which are used for self-aligned gate processes. Conventionally used polysilicon, although having many desirable properties, such as good etchability, good oxidation characteristics, mechanical stability at high temperatures, excellent step coverage and adhesion, has the major disadvantage of a relatively high resistance. A heavily doped 0.5 micron thick polysilicon film, for example, has a sheet resistance of about 20 to 50 ohms per square, which is a major constraint in VLSI circuit design. Therefore, as line widths in VLSI circuits shrink, the major speed limitations arise from the RC time constant associated with silicon gates and polysilicon interconnect lines, thereby limiting high speed performance at very reduced geometries. To reduce interconnect resistivity, it is desirable to deposit refractory metals or metal silicides instead of polysilicon lines.

Refractory metals for VLSI applications are customarily deposited by three different methods: sputtering, evaporation, and chemical vapor deposition. The main advantage of the sputtering process is that both pure refractory metals and refractory metal silicides can be sputtered. The disadvantage of sputtering is poor step coverage.

Evaporation of refractory metals has been investigated as a means for forming VLSI. However, evaporation has many of the deficiencies associated with sputtering. For example, step coverage is poor, and the deposition process is complex using evaporation techniques.

Chemical vapor deposition (CVD) and low-pressure chemical vapor deposition (LPCVD) of refractory metals offer several advantages over sputtering and evaporation techniques. CVD of refractory metals can provide good coverage, reduced system complexity, and higher purity deposits. Also, in some applications, selective CVD does not require an additional photolithography step when the refractory metal is deposited only on areas with certain chemical reactivities. For example, tungsten hexafluoride will react with silicon or polysilicon gates, but not with the surrounding silicon dioxide isolation areas.

However, tungsten films formed in the past by CVD methods have suffered from a number of limitations. Tungsten films formed by the hydrogen reduction of tungsten hexafluoride, according to the equation,

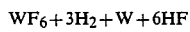   (1)

produce hydrofluoric acid as a by-product. This is undesirable since the HF tends to etch away the silicon dioxide area surrounding the polysilicon gate, potentially destroying the device. Also, the thickness of films formed by the hydrogen reduction method is difficult to reproduce, and the films formed by this method are highly stressed which can cause delamination of the films from the substrate.

Tungsten films also have been formed by the silicon reduction of tungsten hexafluoride according to the equation:

   (2)

This reaction has two major disadvantages. Like the hydrogen method, the films produced by this method are highly stressed. Furthermore, the silicon reduction method requires that silicon be available in order for the reaction to take place. As the tungsten is deposited, less and less silicon is available from the underlying area, which causes the reaction to be self-limiting. Typically, only films of about 30 to 40 nm thickness can be deposited. Beyond this thickness, other methods of depositing tungsten are required.

A refinement of the CVD method consists in decomposing tungsten hexafluoride by igniting a discharge plasma, which permits a drastic reduction in the reaction temperature. This most up-to-date method is known as Plasma Enhanced Chemical Vapor Deposition (PECVD).

However, the reaction gas tungsten hexafluoride used in CVD and PECVD methods poses several severe problems. Tungsten hexafluoride is highly toxic. Due to its boiling point of 17.06° C. and vapor pressure of 1.6 bar at 30° C., longer lines have to be avoided and/or the temperature of the entire supply means has to be stabilized. Further, tungsten hexafluoride has been found to be difficult to control, and it decomposes valves and flow controllers. And, it is difficult to obtain in a highly pure form, and, in addition, when available in that form, it is very expensive.

SUMMARY OF THE INVENTION

Accordingly, it is an object of the present invention to provide a method for depositing tungsten which eliminates the above-mentioned difficulties.

The advantages offered by the invention are mainly that the gas, $WF_x$, which is normally used to deposit tungsten layers or layers containing tungsten, is formed in the plasma deposition chamber by the action of a suitable etch gas on a suitable cathode material, e. g., tungsten.

In accordance with the invention, there is provided a PECVD method for depositing a refractory metal layer on a semiconductor substrate in a plasma deposition chamber, which comprises a refractory metal cathode and an anode. In the method of the invention, a fluoro compound etch gas is reacted with the refractory metal cathode in the deposition chamber to convert the metal to gaseous refractory metal fluorides, and a layer of the refractory metal is deposited on a semiconductor substrate positioned on the anode of the chamber by exposing the substrate to the gaseous refractory metal fluorides.

The invention also provides an apparatus for the deposition of refractory metal layers or layers containing refractory metal on a semiconductor substrate. In accordance with this aspect of the invention, the apparatus comprises a plasma deposition chamber having a port through which a fluoro compound etch gas is introduced into the chamber and a port through which the chamber is evacuated, a refractory metal cathode configuration within the chamber, an anode within the chamber, and energy impression means for ionizing the etch gas in the chamber, whereby the etch gas reacts with the refractory metal cathode configuration to convert the metal to gaseous refractory metal fluorides which decompose to form a deposited layer on a semiconductor substrate positioned on the anode.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 2A is a mass spectrum graph of the gas emerging from the deposition system after the introduction of $CF_4$ into the chamber.

FIG. 2B is a mass spectrum graph of the gas emerging from the deposition system after the introduction of $CF_4$ into the chamber and plasma ignition.

FIG. 2C is a mass spectrum graph of the gas emerging from the deposition system after the introduction of $WF_6$ into the chamber.

DESCRIPTION OF THE PREFERRED EMBODIMENTS

Figure 1:
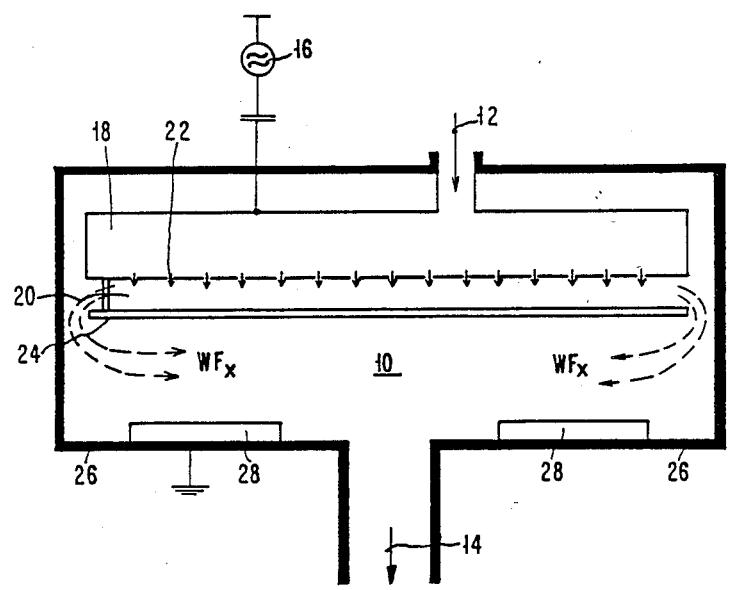
FIG. 1 is an illustration of a plasma deposition system with in situ formation of $WF_x$.

The present invention provides for the reaction gas necessary for the PECVD method to be generated in the plasma deposition chamber by plasma etching a suitable cathode material. For this purpose, the different reaction characteristics at the cathode (etching) and at the anode (deposition) of the plasma deposition chamber are utilized.

The system for carrying out the method of the invention is shown in the schematic of FIG. 1. The apparatus is a modified Plasma Therm PK 14 deposition system operating at 13.56 MHz. The chamber 10 contains a cathode and an anode 26. The cathode configuration consists of an electrode 18 and a tungsten sheet 24 of the same size which is spaced about 1 cm from the electrode 18. The electrode 18 and the tungsten sheet 24 are electrically connected to form a 'hollow cathode'. Silicon wafers 28 are placed on the anode 26 which is spaced about 8 cm from the tungsten sheet 24. The etch gas (e. g., $CF_4$, $NF_3$, $SF_6$, etc.), which acts on the tungsten sheet 24, is introduced into the chamber 10 through a port 12 and enters the hollow cathode region 20 via a gas shower 22. The etch gas is excited by an h.f. generator 16. A vacuum pump (not shown) is provided to evacuate the chamber 10 through the port 14. The operation of the hollow cathode system results in an increased yield of electrons and free radicals in the hollow cathode region 20 between the cathode 18 and the tungsten sheet 24 owing to a higher ionization level of the discharge in this region. As a result, a higher number of $WF_x$ ions will diffuse towards the targets 26 with silicon wafers 28. Details of a hollow cathode system are described, for example, by Ch. M. Horwitz, in "Hollow cathode reactive sputter etching—A new high-rate process", Appl. Phys. Lett. 43(10), Nov. 15, 1983, pp. 977-979, which is incorporated herein by reference.

In accordance with the invention, the action of an etch gas, such as $CF_4$, $SF_6$, $NF_3$, etc., on the tungsten sheet 24 provides active species $WF_x$ which are caused to decompose in the vicinity of the substrates 28, forming a deposited tungsten layer or a layer containing tungsten thereon.

In a practical example, $CF_4$ is bled into the system and a plasma is ignited in the reaction chamber 10. As mentioned above, a spacing of about 1 cm between the cathode 18 and the tungsten sheet 24 is employed. The cathode/anode spacing is not critical; a spacing of about 8 cm is employed. The flow rate of $CF_4$ is about 50 sccm/min. The deposition system operates with an h.f. power of 13.56 MHz. The pressure, monitored by a baratron gauge (not shown), is maintained at a value of 9.0 Pa by a throttle valve (also not shown). The deposition chamber 10 is kept slightly above room temperature at about 50° C. The anode 26 which carries wafers 28 is not heated. The gas which is produced after the introduction of 50 sccm/min. of $CF_4$ and which emerges from the exhaust side of the chamber 10 is analyzed, using a differentially pumped quadrupole mass spectrometer. The method used for this purpose is described by J. Bartha et al. in "IN SITU DETERMINATION OF GROWTH RATE AND STOCHIOMETRY IN A HETEROGENEOUS CVD REACTOR", IBM Technical Disclosure Bulletin, Vol. 29, No. 11, April 1987, p. 4851, which is incorporated herein by reference.

FIGS. 2A-C show mass spectra of the gas emerging from the system under different conditions as measured with identical sensitivity. After the introduction of $CF_4$, no significant masses could be observed in the mass range 150-300 (FIG. 2A). The conditions of FIG. 2B are obtained by plasma ignition.

Particularly evident, are six new groups of mass peaks, each containing four single peaks corresponding to the natural tungsten isotopes 182 (26.5%), 183 (14.5%), 184 (30.5%) and 186 (28.5%). The six groups correspond to W and the fluoro compounds WF, $WF_2$, $WF_3$, $WF_4$, and $WF_5$, respectively. The conclusion to be drawn from this is that $WF_x$ compounds are formed by $CF_4$ etching the tungsten sheet 24 connected to the cathode 18. A gas containing $WF_x$ compounds, i. e. $WF_6$, is normally used to deposit tungsten layers or layers containing tungsten. Systematic tests have shown that the concentration of the $WF_x$ compounds is less dependent on the $CF_4$ flow than on the HF power, which clearly points to a plasma-induced chemical reaction.

However, a quantitative evaluation of the mass spectrum of FIG. 2B is difficult, as the formation of tungsten and/or $WF_x$ constitutes an absolute change. To be able to determine to what inlet flow of $WF_6$ the intensity of tungsten and/or $WF_x$ (FIG. 2B) corresponds, a mixture of nitrogen and $WF_6$ was introduced into the chamber 10. For this purpose, the basic pressure of the chamber was adjusted by a nitrogen flow, then $WF_6$ was added from the outside according to the state of the art, and the tungsten and/or $WF_x$ intensities were determined without maintaining the plasma. FIG. 2C shows the mass spectrum in this case. For a qualitative evaluation, $WF_6$ flows of 0, 10, 20 and 30 sccm/min. were used. It is remarkable that the quality of the cracking pattern of $WF_6$, i. e., the groups to be associated with the tungsten isotopes W, and/or their fluoro compounds WF, $WF_2$, $WF_3$, $WF_4$, and $WF_5$ (FIG. 2C) substantially match those of FIG. 2B. This means that the gas composition of WFx ions formed in situ by the etch reaction according to the invention corresponds to that of the gas formed by the introduction of $WF_6$.

A comparison of the intensities of $WF_x$, formed in situ by the etch reaction, with the intensities formed by the introduction of $WF_6$, indicates that the parameters of the former yield a $WF_x$ concentration in the deposition chamber which corresponds to a $WF_6$ flow of about 7.5 sccm/ min. According to the state of the art (D. L. Brors et al., SEMICONDUCTOR INTERNATIONAL, May 1984, pp. 82-85; and K. Akitmoto et al., Appl. Phys. Lett. 39(5), September 1981, pp. 445-446), $WF_6$ flows of about 5 to 50 sccm/min. are generally used to produce tungsten layers or layers containing tungsten.

In the above example, a layer which clearly contained tungsten was deposited on silicon dioxide wafers 28. The test method used was EDAX (energy dispersive analysis of X-rays). This method is unfortunately insensitive to light elements, such as C or F. Therefore, ESCA (electron spectroscopy for chemical analysis) was used as a further test method. A tungsten layer contaminated with polymerized $CF_4$ was detected. The drawback of polymerized $CF_4$ may be remedied by the use of another etch gas.

The present invention shows that a gas may be chemically produced in a plasma reaction chamber by the reaction of a selected gas with the cathode material. The gas thus produced is suitable for depositing the cathode material on semiconductor substrates arranged on the anode. This deposition method corresponds to the previously mentioned PECVD method with its known advantages, in particular, uniform step coverage of structured substrates. Trends that seem to be emerging in semiconductor technology are to use pure tungsten as a gate material for future chip generations with still lower sheet resistances. Such chip generations also require low process temperatures. These requirements are met by the process according to the invention.

While the invention has been particularly shown and described with reference to preferred embodiments thereof, it will be understood by those skilled in the art that various changes in form and details may be made therein without departing from the spirit and scope of the invention. For example, it should be understood that modifications with respect to the etch gas and the cathode material may be made; specifically, molybdenum or layers containing molybdenum can be deposited in the manner described in conjunction with tungsten.

What is claimed is:

1. A PECVD method for depositing a refractory metal layer on a semiconductor substrate in a plasma deposition chamber, which comprises a refractory metal cathode and an anode, comprising reacting a fluoro compound etch gas with the refractory metal cathode in said deposition chamber to convert said metal to gaseous refractory metal fluorides, wherein said cathode comprises a refractory metal sheet and an electrode and the gaseous refractory metal fluorides are generated by etching said sheet, and wherein the electrode and the refractory metal sheet are electrically connected to form a hollow cathode region, a higher concentration of refractory metal fluoride radicals being generated in the region between said electrode and said refractory metal sheet owing to a higher ionization level of discharge in said region, and depositing a layer of said refractory metal on a semiconductor substrate positioned on the anode of said chamber by exposing said substrate to said gaseous refractory metal fluorides.

2. The method of claim 1, wherein said etch gas for etching the refractory metal cathode to form gaseous refractory metal fluorides is selected from the group consisting of $CF_4$, $NF_3$, and $SF_6$.

3. The method of claim 1, wherein said electrode and said refractory metal sheet are about the same size and are spaced from each other by about 1 cm.

4. The method of claim 3, wherein said refractory metal sheet is a tungsten or molybdenum sheet.

5. The method of any of claims 1-3 or 4, wherein said refractory metal sheet is a tungsten sheet, said etch gas is $CF_4$, and said gaseous refractory metal fluorides are $WF_x$.

6. The method of claim 1, wherein said semiconductor substrate is selected from silicon dioxide or silicon.

* * * * *